(12) United States Patent
Dinca et al.

(10) Patent No.: US 8,937,813 B2
(45) Date of Patent: Jan. 20, 2015

(54) SUB-RACK MOUNTING BRACKET AND ASSEMBLY

(75) Inventors: Claudio Dinca, Genoa (IT); Angelo Rivara, Genoa (IT); Marco Sivori, Genoa (IT)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 14/003,224

(22) PCT Filed: Mar. 4, 2011

(86) PCT No.: PCT/EP2011/053332
§ 371 (c)(1),
(2), (4) Date: Oct. 1, 2013

(87) PCT Pub. No.: WO2012/119638
PCT Pub. Date: Sep. 13, 2012

(65) Prior Publication Data
US 2014/0014600 A1   Jan. 16, 2014

(51) Int. Cl.
*H05K 5/00* (2006.01)
*H05K 7/14* (2006.01)
*H04Q 1/02* (2006.01)
*H05K 7/18* (2006.01)

(52) U.S. Cl.
CPC .............. *H05K 7/1427* (2013.01); *H04Q 1/02* (2013.01); *H05K 7/186* (2013.01); *H05K 7/183* (2013.01)
USPC ....................................................... 361/752

(58) Field of Classification Search
CPC ........... H04Q 1/02; H05K 7/18; H05K 7/186; H05K 7/1425; H05K 7/1427; H05K 7/183

USPC .......... 211/26, 26.2; 248/247, 632, 636, 638; 312/223.2, 223.1, 265.1–265.6; 361/724, 725, 729, 679, 683–686, 752, 361/753, 796, 807, 809

See application file for complete search history.

(56) References Cited

U.S. PATENT DOCUMENTS

| | | | | |
|---|---|---|---|---|
| 4,752,058 A | * | 6/1988 | Weber | 248/638 |
| 5,794,897 A | * | 8/1998 | Jobin et al. | 248/74.4 |
| 5,813,649 A | * | 9/1998 | Peterson et al. | 248/618 |
| 6,587,347 B1 | | 7/2003 | Lane, Jr. et al. | |

(Continued)

OTHER PUBLICATIONS

International Search Report, Application No. PCT/EP2011/053332, Nov. 22, 2011, 2 pages.

(Continued)

*Primary Examiner* — Jennifer E Novosad
(74) *Attorney, Agent, or Firm* — Blakely Sokoloff Taylor & Zafman LLP (57) ABSTRACT

The invention provides a sub-rack mounting bracket for mounting an electrical device sub-rack to an electrical device rack. The sub-rack mounting bracket has an intermediate portion arranged between a first planar portion and a second planar portion of the sub-rack mounting bracket. The first portion, second portion and intermediate portion extend throughout the length of the sub-rack mounting bracket. The Intermediate portion is formed of a sheet material shaped so as to reduce the amplitude of vibrations transmitted to the sub-rack through the sub-rack mounting bracket during use. The invention also provides an assembly of an electrical device sub-rack and at least one sub-rack mounting bracket in accordance with an embodiment of the invention secured to the electrical device sub-rack.

17 Claims, 7 Drawing Sheets

(56) References Cited

U.S. PATENT DOCUMENTS

| | | |
|---|---|---|
| 6,859,363 B1 * | 2/2005 | Chuang .................... 361/679.34 |
| 8,353,446 B2 * | 1/2013 | Cox ............................... 232/39 |
| 2002/0044430 A1 * | 4/2002 | Negishi ......................... 361/752 |
| 2002/0162808 A1 | 11/2002 | Jordan |
| 2006/0145404 A1 * | 7/2006 | Ostergaard .................... 267/165 |
| 2009/0314921 A1 * | 12/2009 | Gould ........................... 248/636 |

OTHER PUBLICATIONS

PCT Written Opinion of the International Searching Authority, Application No. PCT/EP2011/053332, Nov. 22, 2011, 5 pages.

* cited by examiner

SUB-RACK MOUNTING BRACKET AND ASSEMBLY

CROSS-REFERENCE TO RELATED APPLICATIONS

This application is a National stage of International Application No. PCT/EP2011/053332, filed Mar. 4, 2011, which is hereby incorporated by reference.

TECHNICAL FIELD

The present invention relates to a sub-rack mounting bracket for mounting an electrical device sub-rack to an electrical device rack, and to an assembly containing the sub-rack mounting bracket.

BACKGROUND

A system of sub-racks holding electrical device boards within racks of electrical devices is in common use. Typically, the electrical device boards holding electrical devices, including electronic devices, exemplified by but not limited to integrated circuits, resistors, capacitors and memory devices are fitted into slots within a sub-rack. One or more sub-racks are fitted within a rack.

This arrangement enables the electrical connections between different boards to be provided by connections in the sub-rack. In addition, typically electrical power will be supplied to the boards through the sub-rack.

Typically the sub-rack is mounted within the rack using mounting brackets to support the sub-rack within the rack.

Figure 1:
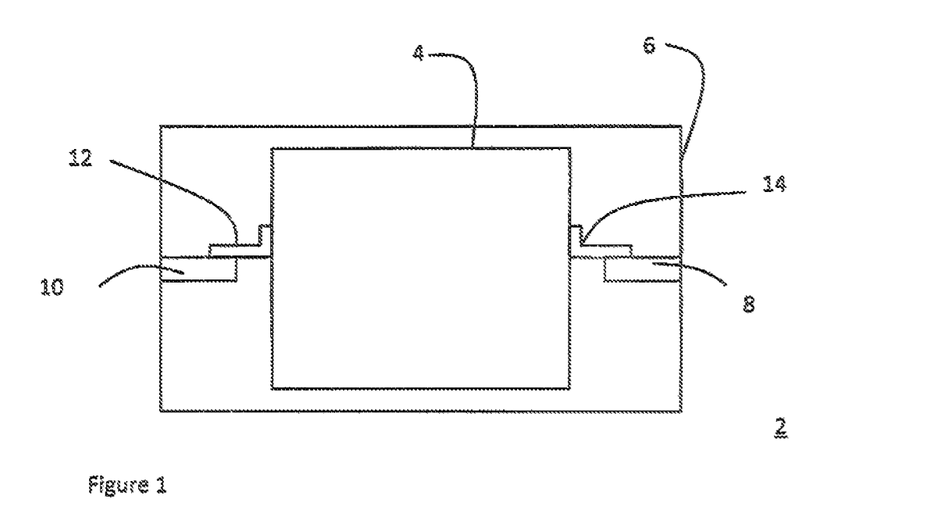
FIG. 1 is a horizontal cross-sectional view of a prior art rack assembly.

FIG. 1 is a horizontal cross-sectional view of a prior art rack assembly 2. The rack assembly 2 comprises a sub-rack 4 for supporting electrical device boards within the sub-rack 4, and a rack 6 for supporting the sub-rack 4. The rack 6 is provided with sub-rack mounting portions 8, 10 and the sub-rack 4 is mounted to the mounting portions 8, 10 of the rack 6 by the mounting brackets 12, 14.

A rack assembly is required to pass various standardised tests. One current example of a standardised test for a rack assembly is ETSI (ETS 300 019 CLASS 3.2) and ANSI (GR-63 PART 19) relating to testing the effect of vibrations.

The invention seeks to provide a novel mounting bracket, and a novel assembly including the mounting bracket.

SUMMARY

In accordance with a first aspect of the invention there is provided a sub-rack mounting bracket for mounting an electrical device sub-rack to an electrical device rack. The sub-rack mounting bracket comprises a first portion extending throughout the length of the mounting bracket for coupling the sub-rack mounting bracket to the rack during use, the first portion being generally planar and arranged in a first plane. The sub-rack mounting bracket also comprises a second portion extending throughout the length of the mounting bracket for coupling the sub-rack mounting bracket to the sub-rack during use, the second portion being generally planar and arranged in a second plane at a constant distance from and orientation to the first plane along the length of the mounting bracket. The sub-rack mounting bracket also comprises an intermediate portion extending throughout the length of the mounting bracket and arranged between the first portion and the second portion, the intermediate portion being formed of a sheet material shaped so as to reduce the amplitude of vibrations transmitted to the sub-rack through the sub-rack mounting bracket during use.

In some embodiments the intermediate portion of the sub-rack mounting bracket enables flexing of the sub-rack mounting bracket relative to at least one of the rack and the sub-rack in response to vibrations.

In some embodiments the sub-rack mounting bracket extends lengthwise along a longitudinal axis of the sub-rack mounting bracket and the intermediate portion enables flexing of the sub-rack mounting bracket in a direction perpendicular to the longitudinal axis of the sub-rack mounting bracket.

In some embodiments the sub-rack mounting bracket extends lengthwise along a longitudinal axis of the sub-rack mounting bracket and the intermediate portion is formed by at least one of a bend portion or a curved portion in the sheet material, the or each bend portion or curved portion being respectively bent in a bend direction or curved in a curve direction perpendicular to the longitudinal axis of the sub-rack mounting bracket.

In some embodiments the bend direction of an at least one bend portion is opposing the curve direction of a curved portion in the sheet material.

In some embodiments the sub-rack mounting bracket extends lengthwise along a longitudinal axis of the sub-rack mounting bracket and the sheet material of the intermediate portion has at least a first bend portion in a first bend direction and a second bend portion in a second bend direction opposite the first bend direction, the first and second bend directions being perpendicular to the longitudinal axis of the sub-rack mounting bracket.

In some embodiments the sheet material of the intermediate portion has a curved portion formed between the first bend portion and the second bend portion of the sheet material.

In some embodiments the sub-rack mounting bracket extends lengthwise along a longitudinal axis of the sub-rack mounting bracket and at least a portion of the bracket has a substantially U shaped or V-shaped cross section perpendicular to the longitudinal axis of the mounting bracket.

In some embodiments the bracket is formed from an electrically conductive sheet material.

In some embodiments the bracket is adapted to mount a circuit board sub-rack in a rack.

In accordance with a second aspect of the invention there is provided an assembly comprising an electrical device sub-rack and at least one sub-rack mounting bracket in accordance with the invention secured to the electrical device sub-rack.

In some embodiments of a second aspect of the invention the assembly also comprises an electrical device rack. The at least one sub-rack mounting bracket is secured to the sub-rack and the rack so as to mount the sub rack to the rack.

BRIEF DESCRIPTION OF THE DRAWINGS

The invention will now be described by way of example with reference to the accompanying drawings.

DETAILED DESCRIPTION

As will be described in more detail in the following description, a sub-rack mounting bracket in accordance with embodiments of the invention extends lengthwise in the direction of a longitudinal axis denoting a main direction of extension of the mounting bracket.

The sub-rack mounting bracket in accordance with embodiments of the invention is formed with a first portion, a second portion, and an intermediate portion arranged between the first portion and the second portion. Each of the first portion, second portion and intermediate portion extends throughout the length of the mounting bracket in the direction of the longitudinal axis of the mounting bracket.

The first portion and the second portion of the mounting bracket are generally planar and are formed in respective planes at a constant distance from, and orientation to, each other along the length of the mounting bracket. This results in the cross-sectional shape of the mounting bracket in a plane perpendicular to the longitudinal axis of the mounting bracket being constant along the longitudinal length of the mounting bracket.

The first portion of the sub-rack mounting bracket is adapted for coupling the sub-rack mounting bracket to the rack during use of the mounting bracket. Typically the first portion is formed in a plane that is oriented to be parallel to the surface of a rack to which the sub-rack mounting bracket is to be coupled during use of the mounting bracket to mount the sub-rack in the rack. In some embodiments, during use the mounting bracket is coupled to the mounting portions of a rack.

The second portion is adapted for coupling the sub-rack mounting bracket to the sub-rack during use of the mounting bracket. Typically the second portion is formed in a plane that is oriented to be parallel to the surface of the sub-rack to which the sub-rack mounting bracket is to be coupled during use of the mounting bracket to mount the sub-rack in the rack.

The relative orientation of the first portion and second portion of a standard mounting bracket can be determined by a skilled person considering the relative orientations of a standard rack and sub-rack assembly. Alternatively the relative orientation of the first portion and second portion of a bespoke mounting bracket can be determined by a skilled person considering the relative orientations of a non-standard rack and sub-rack assembly.

The intermediate portion is arranged between the first portion and the second portion, and is formed of a sheet material shaped so as to reduce the amplitude of vibrations transmitted to the sub-rack through the mounting bracket during use.

Embodiments of the invention will now be described with reference to FIGS. 2-10.

Figure 2:
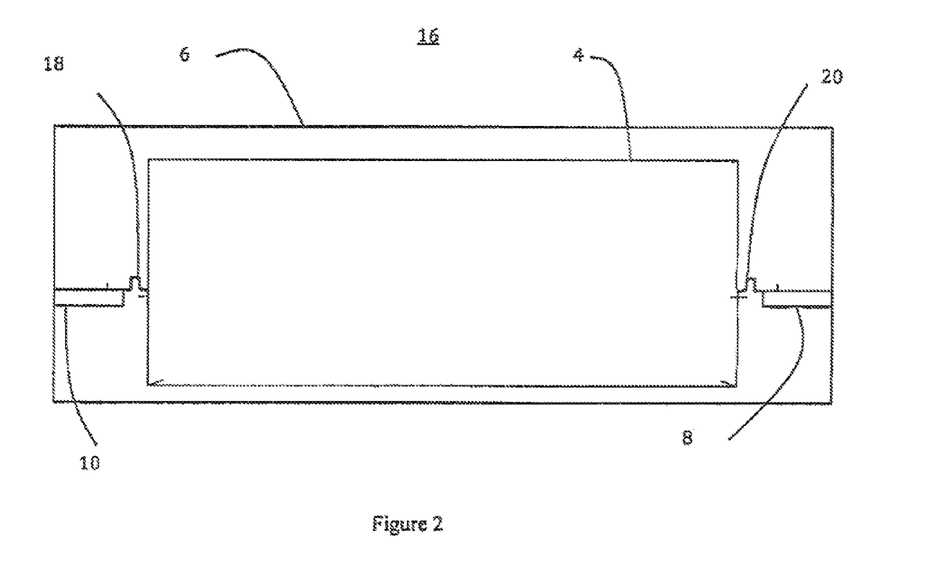
FIG. 2 is a horizontal cross sectional view of a rack assembly in accordance with one embodiment.

FIG. 2 shows a horizontal cross section through a rack assembly 16 in accordance with one embodiment. Parts that are the same as the prior art portions shown in FIG. 1 have been given the same reference numerals, for clarity.

The rack assembly 16 comprises a rack 6 with mounting portions 8, 10. A sub-rack 4 is supported on the mounting portions 8, 10 by mounting brackets 18, 20 in accordance with an exemplary embodiment of the invention. The sub-rack 4 and mounting brackets 18, 20 form a sub-rack assembly 22.

Figure 3:
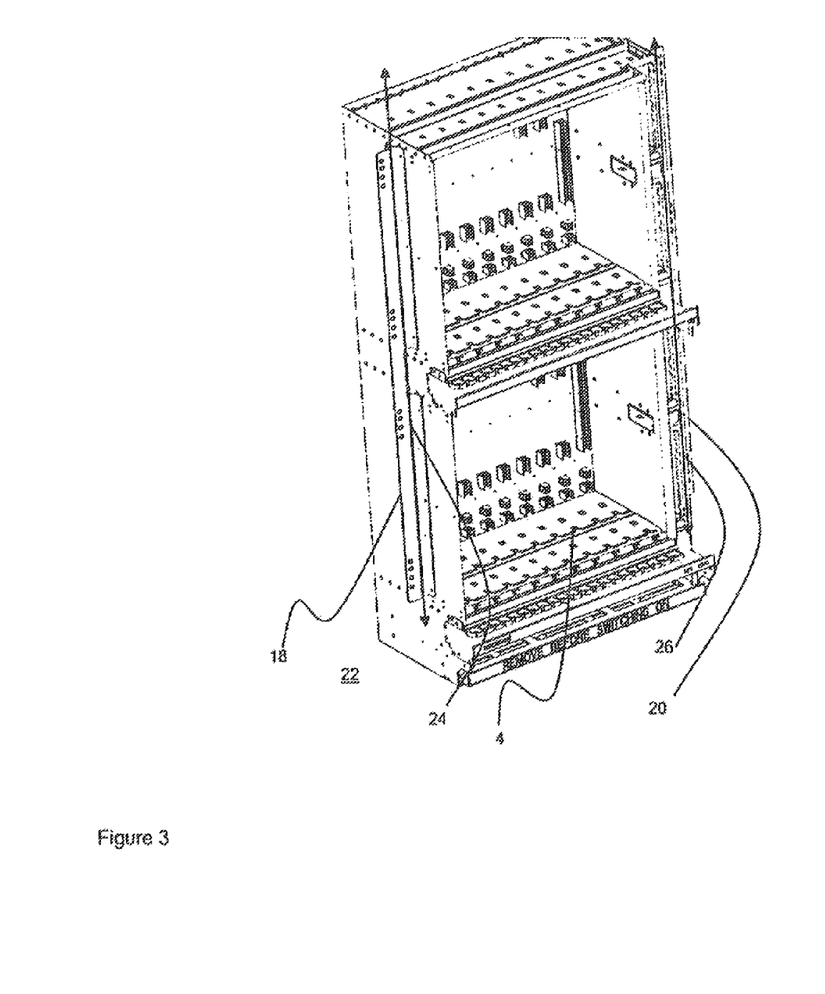
FIG. 3 is a perspective view of a sub-rack assembly showing exemplary mounting brackets mounted on the sub-rack.

FIG. 3 is a perspective view of a sub-rack assembly 22 with a first mounting sub-rack bracket 18 and a second sub-rack mounting bracket 20 in accordance with a first exemplary embodiment. As can be clearly seen in FIG. 2, the exemplary mounting brackets 18, 20 extend lengthwise in the direction of a respective longitudinal axis 24, 26 denoting a main direction of extension of the respective mounting bracket 18, 20.

As will be described in more detail in the following description, each of the exemplary mounting brackets 18, 20 shown in FIG. 2 is formed with a first generally planar portion, a second generally planar portion, and an intermediate portion arranged between the first portion and the second portion. Each of the first portion, second portion and intermediate portion of each mounting bracket extends throughout the length of the mounting bracket 18, 20 in the direction of the respective longitudinal axis 24, 26 shown in FIG. 2.

Figure 4:
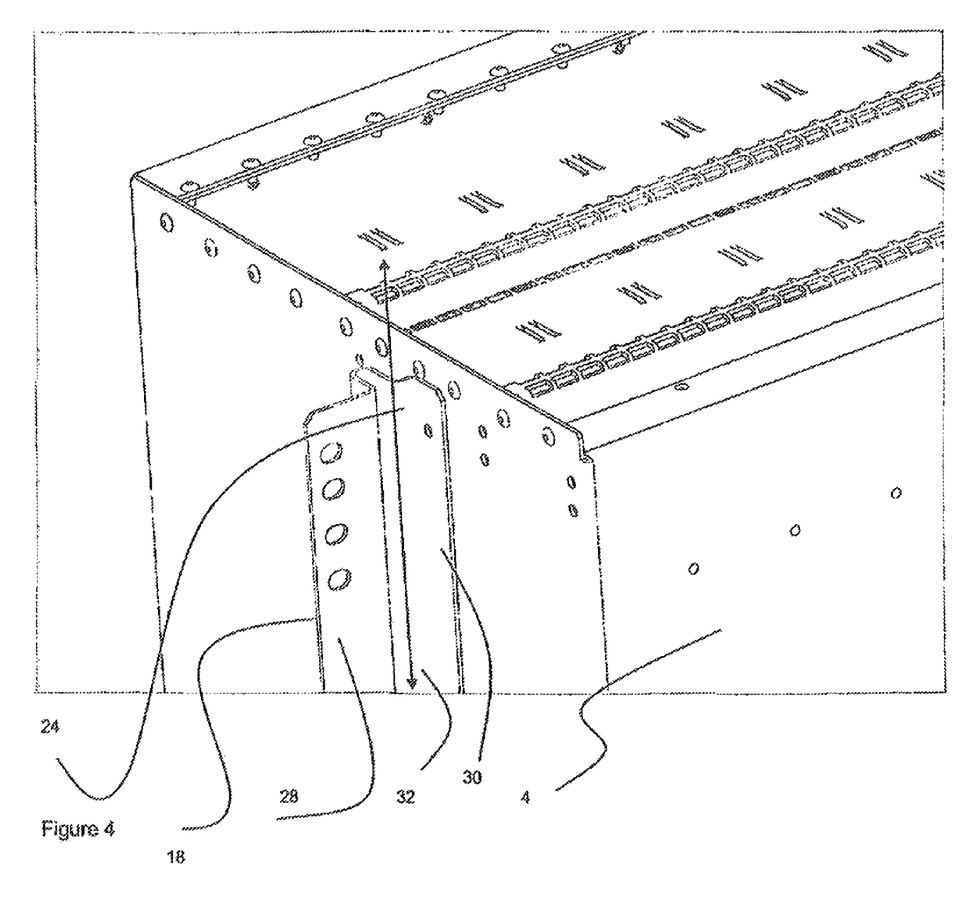
FIG. 4 is a perspective view of a portion of an exemplary mounting bracket mounted on the sub-rack shown in FIG. 3.

Since the features of sub-rack mounting bracket 20 correspond with the features of sub rack mounting bracket 18, only sub-rack mounting bracket 18 will be described in more detail with reference to FIG. 4, which is a partial perspective drawing of the sub-rack mounting bracket 18 and sub-rack 4.

A first portion 28 of sub-rack mounting bracket 18 is arranged for coupling the sub-rack mounting bracket 18 to the rack mount portion 10 of rack 6 during use of the mounting bracket 18. The first portion 28 of sub-rack mounting bracket 18 in the exemplary embodiment shown in FIG. 4 is formed in a plane that is parallel to the expected position of mounting portion 10 of the rack 6.

A second portion 30 of sub-rack mounting bracket 18 is arranged for coupling the sub-rack mounting bracket 18 to the sub-rack 4 during use of the mounting bracket 18. The second portion 30 of sub-rack mounting bracket 18 is formed in a plane parallel to the surface of the sub-rack 4 to which the sub-rack mounting bracket is coupled.

An intermediate portion 32 of the sub-rack mounting bracket 18 is arranged between the first portion 28 and the second portion 30, and is formed of a sheet material shaped so as to reduce the amplitude of vibrations transmitted to the sub-rack 4 through the sub-rack mounting bracket 18 during use, as will be explained in more detail with reference to FIG. 8.

The first portion 28 and the second portion 32 of the mounting bracket 18 are formed in respective planes at a constant distance from, and orientation to, each other along the length of the mounting bracket, and therefore the cross-section of the mounting bracket 18 is constant along its length.

Figure 5:
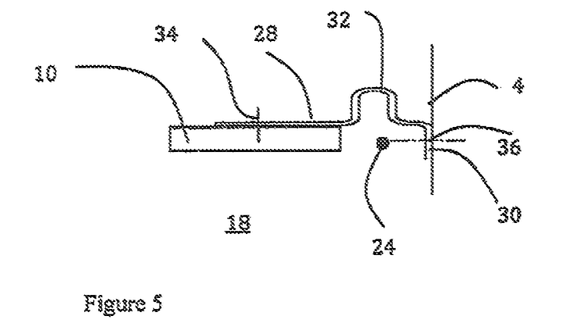
FIG. 5 is a more detailed cross-sectional view of the mounting bracket shown in FIG. 4.

FIG. 5 is a more detailed partial cross-sectional view of the mounting bracket 18 shown in FIG. 4 mounted to the mounting portion 10 of the rack 6 and to the sub-rack 4. In FIG. 5 the longitudinal axis 24 of the sub-rack mounting bracket 18 runs perpendicularly to the plane of the paper, and is denoted by a circle 24.

As shown in FIG. 5, the mounting bracket 18 is provided with a first portion 28 arranged to be secured to the rack mounting portion 10 of the rack 6 by fastening means 34. In this embodiment the first portion 28 is provided with holes therein through which screws may be used to secure the first portion 28, and hence the mounting bracket 18, to the rack mounting portion 10 of the rack 6. In other embodiments the mounting bracket 18 may be provided with other suitable fastening means 34 to secure the mounting bracket 18 to the rack mounting portion 10 of the rack 6.

In addition, the mounting bracket 18 is provided with a second portion 30 arranged to be secured to the sub-rack 4 by the sub-rack fastening means 36. In this embodiment the second portion 30 is provided with holes therein through which screws may be used to secure the second portion 30, and hence the mounting bracket 18, to the sub-rack 4. In other embodiments the mounting bracket 18 may be provided with other suitable sub-rack fastening means 36 to secure the mounting bracket 18 to the sub-rack 4.

The mounting bracket 18 is also provided with intermediate portion 32 arranged between the first portion 28 and the second portion 30 that is formed of a sheet material shaped so as to reduce the amplitude of vibrations transmitted to the sub-rack 4 through the sub-rack mounting bracket 18 during use, as will be explained in more detail with reference to FIG. 8.

Figure 6:
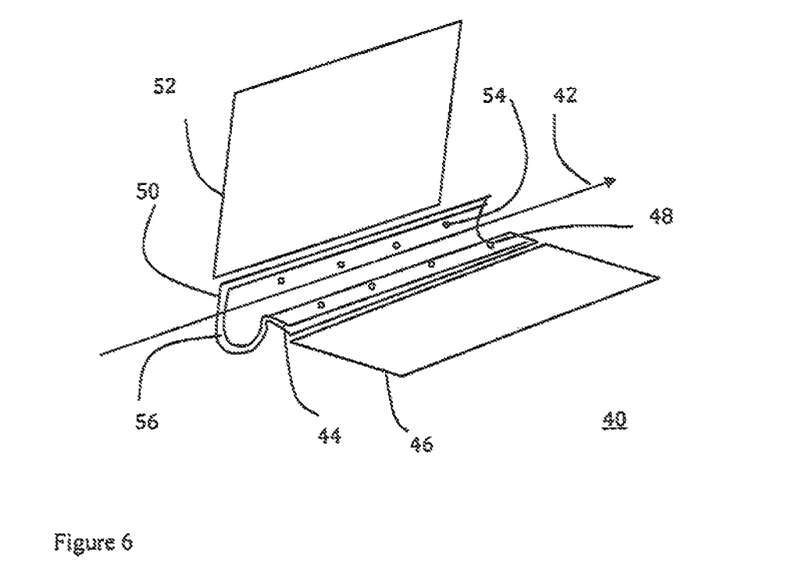
FIG. 6 is a perspective view of an embodiment of mounting bracket.

FIG. 6 is a perspective view of sub-rack mounting bracket 40 in accordance with a further embodiment. A longitudinal axis 42 is shown, which denotes a main direction of extension of the sub-rack mounting bracket 40.

The sub-rack mounting bracket 40 is provided with a first portion 44 arranged for coupling the sub-rack mounting bracket 40 to the rack mount portion 10 (not shown in FIG. 6) of rack 6. The first portion 44 is generally planar and arranged in a plane 46. The first portion 44 is provided with rack fastening means 48 to enable the first portion 44 to be secured to the rack mounting portion 10 of the rack 6. In this embodiment the rack fastening means 48 are holes through which screws may be used to secure the first portion 44 to the rack mounting portion 10 of the rack 6. In other embodiments the sub-rack mounting bracket 40 may be secured to the rack mounting portion 10 by other suitable fastening means as will be apparent to a skilled person.

In addition, the sub-rack mounting bracket 40 is provided with a second portion 50 arranged for coupling the sub-rack mounting bracket 40 to the sub-rack 4 (not shown in FIG. 6). The second portion 50 is generally planar and arranged in a plane 52. The second portion 50 is provided with sub-rack fastening means 54 to enable the second portion 50 to be secured to the sub-rack 4. In this embodiment the sub-rack fastening means 54 are holes through which screws may be used to secure the second portion 50 to the sub-rack 4. In other embodiments the sub-rack mounting bracket 40 may be secured to the sub-rack 4 by other suitable fastening means as will be apparent to a skilled person.

The planes 46, 52 are at a constant distance from, and orientation to, each other along the length of the mounting bracket 40, as will be apparent to a skilled person from a consideration of FIG. 6.

In addition, the sub-rack mounting bracket 40 is provided with an intermediate portion 56 arranged between the first portion 44 and the second portion 50 that is formed of a sheet material shaped so as to reduce the amplitude of vibrations transmitted to the sub-rack 4 through the sub-rack mounting bracket 40 during use, as will be explained in more detail with reference to FIG. 9.

Figure 7:
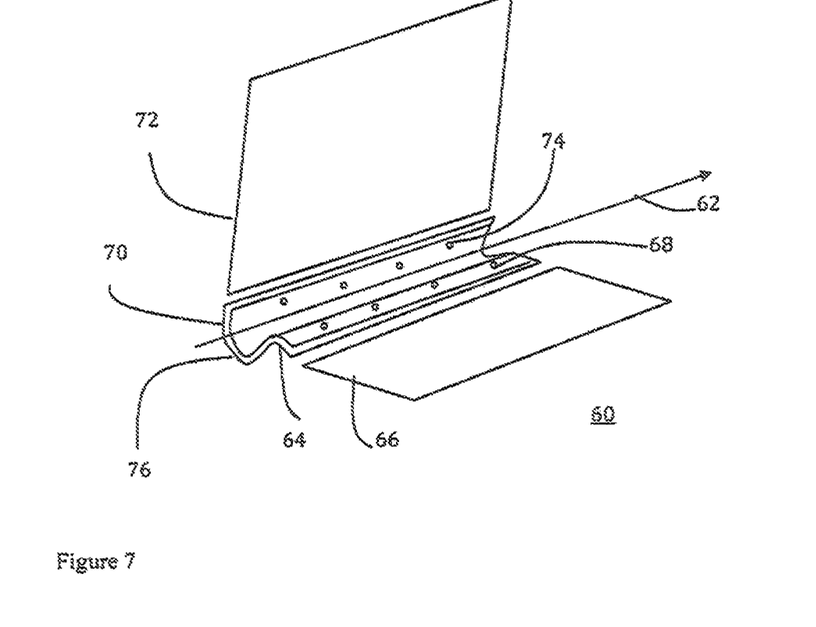
FIG. 7 is a perspective view of an additional embodiment of mounting bracket.

FIG. 7 is a perspective view of sub-rack mounting bracket 60 in accordance with a further embodiment. A longitudinal axis 62 is shown, which denotes a main direction of extension of the sub-rack mounting bracket 60.

The sub-rack mounting bracket 60 is provided with a first portion 64 arranged for coupling the sub-rack mounting bracket 60 to the rack mount portion 10 (not shown in FIG. 7) of rack 6. The first portion 64 is generally planar and arranged in a plane 66. The first portion 64 is provided with rack fastening means 68 to enable the first portion 64 to be secured to the rack mounting portion 10 of the rack 6. In this embodiment the rack fastening means 68 are holes through which screws may be used to secure the first portion 64 to the rack mounting portion 10 of the rack 6. In other embodiments the sub-rack mounting bracket 60 may be secured to the rack mounting portion 10 by other suitable fastening means as will be apparent to a skilled person.

In addition, the sub-rack mounting bracket 60 is provided with a second portion 70 arranged for coupling the sub-rack mounting bracket 60 to the sub-rack 4 (not shown in FIG. 7). The second portion 70 is generally planar and arranged in a plane 72. The second portion 70 is provided with sub-rack fastening means 74 to enable the second portion 70 to be secured to the sub-rack 4. In this embodiment the sub-rack fastening means 74 are holes through which screws may be used to secure the second portion 70 to the sub-rack 4. In other embodiments the sub-rack mounting bracket 60 may be secured to the sub-rack 4 by other suitable fastening means as will be apparent to a skilled person.

The planes 66, 72 are at a constant distance from, and orientation to, each other along the length of the mounting bracket 60, as will be apparent to a skilled person from a consideration of FIG. 7.

In addition, the sub-rack mounting bracket 60 is provided with an intermediate portion 76 arranged between the first portion 64 and the second portion 70 that is formed of a sheet material shaped so as to reduce the amplitude of vibrations transmitted to the sub-rack 4 through the sub-rack mounting bracket 60 during use, as will be explained in more detail with reference to FIG. 10.

The structure and the influence of the structure on the operation of embodiments of the invention will now be described in more detail with reference to FIGS. 8-10 of the accompanying drawings. The same reference numerals have been used in FIGS. 8-10 for the same parts as shown in FIGS. 2-7.

Figure 8:
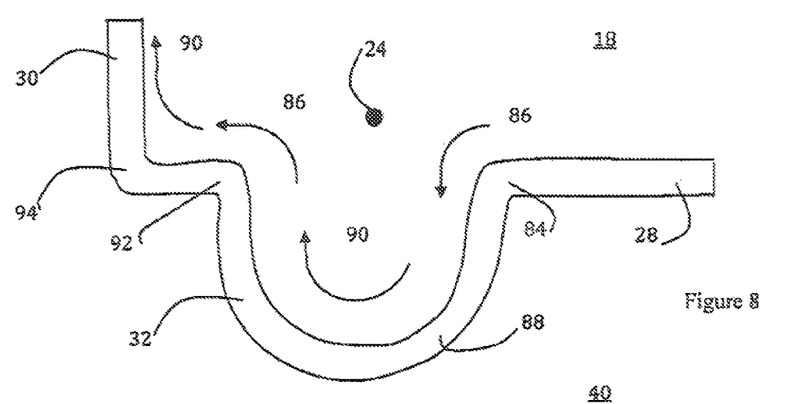
FIG. 8 is a cross-sectional view of the embodiment shown in FIGS. 2-5.

FIG. 8 is a cross-sectional view of the sub-rack mounting bracket 18 shown in FIGS. 2-5. FIG. 9 is a cross-sectional view of the sub-rack mounting bracket 40 shown in FIG. 6. FIG. 10 is a cross-sectional view of the sub-rack mounting bracket 60 shown in FIG. 7. In each of FIGS. 8-10 it will be understood by a skilled person that the mounting brackets extend in a direction along a respective longitudinal axis 24, 42, 62 perpendicular to the plane of the paper.

As discussed previously, the first portions 28, 44, 64 and second portions 30, 50, 70 of the sub-rack mounting brackets 18, 40, 60 are formed in respective planes (not shown in FIGS. 8-10) at a constant distance from, and orientation to, each other along the length of the mounting bracket 18, 40, 60, as will be apparent to a skilled person. In FIGS. 8-10 the planes are perpendicular to the plane of the paper.

In each of the mounting brackets 18, 40, 60, the respective plane in which a first portion 28, 44, 64 is formed is perpendicular to the respective plane in which the corresponding second portion 30, 50, 70 is formed. However, as a skilled person will appreciate in some embodiments a different orientation may be selected, depending upon the relative orientations of the surfaces onto which the mounting bracket is to be secured.

The intermediate portion 32, 56, 76 is formed of a sheet material shaped so as to reduce the amplitude of vibrations transmitted to the sub-rack through the sub-rack mounting bracket during use. In embodiments the intermediate portion 32, 56, 76 enables flexing of the sub-rack mounting bracket relative to the rack 6 and/or the sub-rack 4, in particular in a direction 80, 82 perpendicular to the longitudinal axis 24, 42, 62 of the bracket 18, 40, 60.

Figure 9:
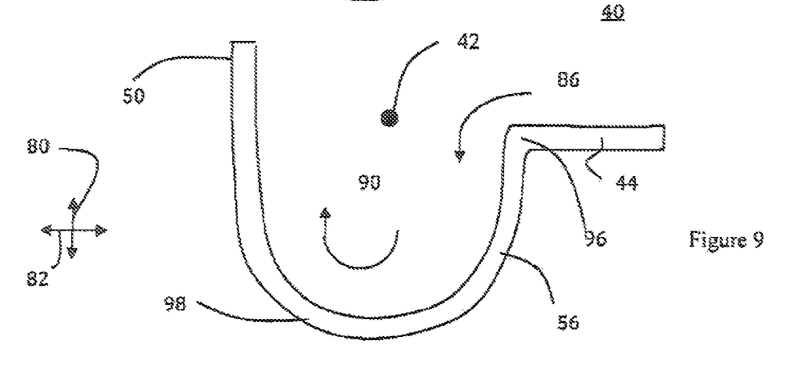
FIG. 9 is a cross-sectional view of the embodiment shown in FIG. 6.
Figure 10:
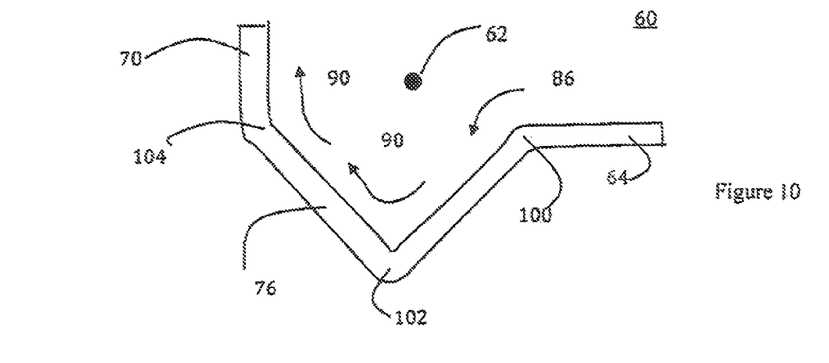
FIG. 10 is a cross-sectional view of the embodiment shown in FIG. 7.

As will be appreciated by a skilled person from a consideration of FIGS. 2-10, vibrations experienced by the rack 6 are transmitted via the rack mounting portion 10 to the respective first portion 28, 44, 64 of the mounting bracket 18, 40, 60. Such movement is likely to be primarily a horizontal movement of the rack, which is shown in FIGS. 8-10 as movements 80, 82 in the plane of the paper, and all horizontal movements of the rack 6 can be viewed as a combination of movements in the directions 80, 82 in FIGS. 8-10.

The intermediate portions 32, 56, 76 of embodiments of the invention are shaped so that intermediate portion 32, 56, 76 flexes in response to movement of the first portion 28, 44, 64 in the direction 80, 82 so that the resulting vibration of the second portion 30, 50, 70 is reduced in amplitude compared with the vibration of the first portion 28, 44, 64.

In the exemplary embodiment shown in FIG. 8, the intermediate portion 32 has:
- a first bend portion 84 with an first bend direction 86;
- a curved portion 88 with a second bend direction 90;
- a second bend portion 92 with a first bend direction 86; and
- a third bend portion 94 with a second bend direction 90.

In the exemplary embodiment shown in FIG. 9, the intermediate portion 56 has:
- a first bend portion 96 with an first bend direction 86;
- a curved portion 98 with a second bend direction 90.

In the exemplary embodiment shown in FIG. 8, the intermediate portion 76 has:
- a first bend portion 100 with an first bend direction 86;
- a second bend portion 102 with a second bend direction 90; and
- a third bend portion 104 with a second bend direction 90.

In embodiments the intermediate portion 32, 56, 76 is formed of a sheet material having at least one bend portion and at least one of a curved portion that is curved in a curve direction or a bend portion that is bent in a bend direction perpendicular to the longitudinal axis of the mounting bracket. The bends or curves in the sheet material of the intermediate portion enable flexing of the intermediate portion in directions 80, 82 perpendicular to the longitudinal axis of the mounting bracket in response to vibrations or movements of the mounting portion 10 of the rack 6.

In some embodiments, the sheet material of the intermediate portion 32, 56, 76 is bent or curved in at least two opposing directions 86, 90 perpendicular to the longitudinal axis of the mounting bracket.

In some embodiments, the first portion 28, 44, 64, the second portion 30, 50, 70, and the intermediate portion 32, 56, 76 of the mounting bracket 18, 40, 60 are formed from a single piece of sheet material.

In some embodiments it may be necessary to provide an electrical coupling between the rack 6 and the sub-rack 4 via the mounting bracket. In some embodiments a separate electrical connection may be provided. In other embodiments, the mounting bracket 18, 40, 60 may provide an electrical connection between the rack 6 and the sub-rack 4, for example by being formed may be formed from sheet metal.

The dimensions of the mounting bracket and the relative orientations of the first portion 28, 44, 64, for securing the mounting bracket to the rack 6, and the second portion, 30, 50, 70 for securing the mounting bracket to the sub-rack, may be selected by a skilled person depending upon the sizes and relative orientations of the rack and sub-racks with which the mounting brackets are to be used.

Some embodiments may be used in standard electrical device rack assemblies in which a number of electrical device boards holding electrical devices, including electronic devices, exemplified by but not limited to integrated circuits, resistors, capacitors and memory devices are fitted into slots within the sub-rack 4.

In a typical arrangement a device rack 6 has dimensions of 600 mm×300 mm×2200 mm, although embodiments may be implemented within rack 6 having other dimensions. The sub-rack is dimensioned to fit inside the device rack, taking into account the required tolerances, and to support one or more electrical device boards such as circuit boards. In a typical arrangement the sub-rack 4 has a width in the range 400-500 mm; a depth of around 280 mm or possibly a greater depth to around 580 mm in a device rack with greater depth; and a height in the range 25-1950 mm. The dimensions of the mounting bracket 18, 40, 60 are selected by a skilled person to support the sub-rack and might have a width and depth each of the order of 40-60 mm. The height of the mounting bracket 18, 40, 60 is selected to provide a secure mounting for the height of a sub-rack. Typically, a mounting bracket might have dimensions of 50 mm×50 mm×800 mm. In any event embodiments of the invention may be used for electrical device racks and sub-racks with different dimensions as will be apparent to a skilled person.

In some embodiments the longitudinal dimension of the mounting bracket is significantly greater than the other dimensions of the mounting bracket. In some embodiments, the longitudinal dimension of the mounting bracket is between 10 and 20 times greater than the other dimensions of the mounting bracket.

Modifications and other embodiments of the disclosed invention will come to mind to one skilled in the art having the benefit of the teachings presented in the foregoing description and the associated drawings. Therefore it is to be understood that the invention is not to be limited to specific embodiments disclosed and that modifications and other embodiments are intended to be included within the scope of this disclosure. Although specific terms may be employed herein, they are used in a generic and descriptive sense only and not for the purposes of limitation.

The invention claimed is:

1. A sub-rack mounting bracket for mounting an electrical device sub-rack to an electrical device rack, comprising:
   a first portion extending throughout the length of the sub-rack mounting bracket for coupling the sub-rack mounting bracket to the electrical device rack during use, the first portion being generally planar and arranged in a first plane;
   a second portion extending throughout the length of the sub-rack mounting bracket for coupling the sub-rack mounting bracket to the electrical device sub-rack during use, the second portion being generally planar and arranged in a second plane at a constant distance from and orientation to the first plane along the length of the sub-rack mounting bracket; and
   an intermediate portion extending throughout the length of the sub-rack mounting bracket and arranged between the first portion and the second portion, the intermediate portion enabling flexing of the sub-rack mounting bracket relative to at least one of the electrical device rack and the electrical device sub-rack in response to vibrations, wherein the sub-rack mounting bracket extends lengthwise along a longitudinal axis of the sub-rack mounting bracket and the intermediate portion is formed by a first bend portion, a second bend portion, and a third bend portion, or the intermediate portion comprises a curved portion in the sheet material, each bend portion or the curved portion being respectively bent in a bend direction or curved in a curve direction perpendicular to the longitudinal axis of the sub-rack mounting bracket.

2. The sub-rack mounting bracket as claimed in claim 1, wherein the intermediate portion enables flexing of the sub-rack mounting bracket in a direction perpendicular to the longitudinal axis of the sub-rack mounting bracket.

3. The sub-rack mounting bracket as claimed in claim 1, wherein the bend direction of a bend portion is opposing the curve direction of a curved portion in the sheet material.

4. The sub-rack mounting bracket as claimed in claim 1, the sheet material of the intermediate portion has at least a first bend portion in a first bend direction and a second bend portion in a second bend direction opposite the first bend direction, the first and second bend directions being perpendicular to the longitudinal axis of the sub-rack mounting bracket.

5. The sub-rack mounting bracket as claimed in claim 4, wherein the sheet material of the intermediate portion has a curved portion formed between the first bend portion and the second bend portion of the sheet material.

6. The sub-rack mounting bracket as claimed in claim 1, wherein at least a portion of the sub-rack mounting bracket has a substantially U shaped or V-shaped cross section perpendicular to the longitudinal axis of the sub-rack mounting bracket.

7. The sub-rack mounting bracket as claimed in claim 1, wherein the sub-rack mounting bracket is formed from an electrically conductive sheet material.

8. The sub-rack mounting bracket as claimed in claim 1, wherein the electrical device sub-rack is a circuit board sub-rack.

9. An assembly comprising:
an electrical device sub-rack; and
at least one sub-rack mounting bracket for mounting the electrical device sub-rack to an electrical device rack, wherein the sub-rack mounting bracket including:
a first portion extending throughout the length of the sub-rack mounting bracket for coupling the sub-rack mounting bracket to the electrical device rack during use, the first portion being generally planar and arranged in a first plane;
a second portion extending throughout the length of the sub-rack mounting bracket for coupling the sub-rack mounting bracket to the electrical device sub-rack during use, the second portion being generally planar and arranged in a second plane at a constant distance from and orientation to the first plane along the length of the sub-rack mounting bracket; and
an intermediate portion extending throughout the length of the sub-rack mounting bracket and arranged between the first portion and the second portion, the intermediate portion being formed of a sheet material shaped so as to reduce the amplitude of vibrations transmitted to the electrical device sub-rack through the sub-rack mounting bracket during use, wherein the sub-rack mounting bracket extends lengthwise along a longitudinal axis of the sub-rack mounting bracket and the intermediate portion is formed by a first bend portion, a second bend portion, and a third bend portion, or the intermediate portion comprises a curved portion in the sheet material, each bend portion or the curved portion being respectively bent in a bend direction or curved in a curve direction perpendicular to the longitudinal axis of the sub-rack mounting bracket.

10. The assembly as claimed in claim 9 further comprising:
the electrical device rack, wherein the at least one sub-rack mounting bracket is secured to the electrical device sub-rack and the electrical device rack so as to mount the electrical device sub-rack to the electrical device rack.

11. A method of mounting an electrical device sub-rack to an electrical device rack using a sub-rack mount bracket, comprising:
coupling the sub-rack mounting bracket to the electrical device rack through a first portion of the sub-rack mounting bracket, wherein the first portion extends throughout the length of the sub-rack mounting bracket, and wherein the first portion is generally planar and arranged in a first plane; and
coupling the sub-rack mounting bracket to the electrical device sub-rack through a second portion of the sub-rack mounting bracket, wherein the second portion extends throughout the length of the sub-rack mounting bracket, and wherein the second portion is generally planar and arranged in a second plane at a constant distance from and orientation to the first plane along the length of the sub-rack mounting bracket,
wherein the sub-rack mounting bracket contains an intermediate portion extending throughout the length of the sub-rack mounting bracket and arranged between the first portion and the second portion, the intermediate portion being formed of a sheet material shaped so as to reduce the amplitude of vibrations transmitted to the electrical device sub-rack through the sub-rack mounting bracket, wherein the sub-rack mounting bracket extends lengthwise along a longitudinal axis of the sub-rack mounting bracket and the intermediate portion is formed by a first bend portion, a second bend portion, and a third bend portion, or the intermediate portion comprises a curved portion in the sheet material, each bend portion or the curved portion being respectively bent in a bend direction or curved in a curve direction perpendicular to the longitudinal axis of the sub-rack mounting bracket.

12. The method of claim 11, wherein the intermediate portion of the sub-rack mounting bracket enables flexing of the sub-rack mounting bracket relative to at least one of the electrical device rack and the electrical device sub-rack in response to vibrations.

13. The method of claim 12, wherein the intermediate portion enables flexing of the sub-rack mounting bracket in a direction perpendicular to the longitudinal axis of the sub-rack mounting bracket.

14. The method of claim 11, wherein the bend direction of a bend portion is opposing the curve direction of a curved portion in the sheet material.

15. The method of claim 11, wherein the sheet material of the intermediate portion has at least a first bend portion in a first bend direction and a second bend portion in a second bend direction opposite the first bend direction, the first and second bend directions being perpendicular to the longitudinal axis of the sub-rack mounting bracket.

16. The method of claim 15, wherein the sheet material of the intermediate portion has a curved portion formed between the first bend portion and the second bend portion of the sheet material.

17. The method of claim 11, wherein at least a portion of the sub-rack mounting bracket has a substantially U shaped or V-shaped cross section perpendicular to the longitudinal axis of the sub-rack mounting bracket.

* * * * *